United States Patent
Kaida et al.

(10) Patent No.: US 8,544,168 B2
(45) Date of Patent: Oct. 1, 2013

(54) PART-MOUNTING, INSPECTING AND REPAIRING METHOD

(75) Inventors: Kenichi Kaida, Osaka (JP); Kenichiro Ishimoto, Yamanashi (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/320,811

(22) PCT Filed: Oct. 7, 2010

(86) PCT No.: PCT/JP2010/006022
§ 371 (c)(1),
(2), (4) Date: Nov. 16, 2011

(87) PCT Pub. No.: WO2011/043080
PCT Pub. Date: Apr. 14, 2011

(65) Prior Publication Data
US 2012/0060357 A1      Mar. 15, 2012

(30) Foreign Application Priority Data

Oct. 8, 2009  (JP) ................................ 2009-234039

(51) Int. Cl.
*H05K 3/34*      (2006.01)
(52) U.S. Cl.
USPC ................. 29/832; 29/833; 29/840; 29/740
(58) Field of Classification Search
USPC ............... 29/833–834, 840, 564.1, 705, 712, 29/719–721; 174/255–264, 52.4
See application file for complete search history.

(56) References Cited

U.S. PATENT DOCUMENTS 5,991,435 A * 11/1999 Tsujikawa et al. ............ 382/147
6,145,190 A * 11/2000 Shin et al. ........................ 29/840

(Continued)

FOREIGN PATENT DOCUMENTS

JP    2004-039819 A    2/2004
JP    2005-286015 A    10/2005

(Continued)

OTHER PUBLICATIONS

International Search Report for PCT/JP2010/006022 dated Nov. 9, 2010.

*Primary Examiner* — Minh Trinh
(74) *Attorney, Agent, or Firm* — Pearne & Gordon LLP

(57) ABSTRACT

It is an objective to provide a part-mounting method that, even when parts are extremely small, makes it possible to mount the parts at a repair-requiring location without fail, to thus enhance a percentage of a non-defective substrate. In a part-mounting method, inspection is made as to whether or not a parts-missing location exists on a substrate Pb reloaded between a solder printer 2 and a first part-mounting machine 4A after having undergone manual repair by an operator OP, or the like, in connection with a repair-requiring location found through inspection performed after mounting of parts Pt, by use of an inspection camera 15A of a first part-mounting machine 4A. When a parts-missing location on the substrate Pb is found, the parts-missing location is identified. Subsequently, a mounting head 14A of the first part-mounting machine 4A and a mounting head 14B of a second part-mounting machine 4B mount a part Pt at the parts-missing location on the thus-identified substrate Pb.

3 Claims, 8 Drawing Sheets

(56) References Cited

U.S. PATENT DOCUMENTS

| | | | |
|---|---|---|---|
| 6,286,202 B1* | 9/2001 | Asai et al. | 29/740 |
| 6,293,007 B1* | 9/2001 | Kuriyama et al. | 29/840 |
| 6,295,728 B1* | 10/2001 | Shin et al. | 29/840 |
| 2002/0083570 A1* | 7/2002 | Inoue et al. | 29/428 |
| 2002/0157488 A1* | 10/2002 | Nagafuku et al. | 73/866.5 |
| 2002/0194729 A1* | 12/2002 | Kuribayashi et al. | 29/834 |
| 2011/0007146 A1 | 1/2011 | Kaida et al. | |

FOREIGN PATENT DOCUMENTS

| | | |
|---|---|---|
| JP | 2007-096153 A | 4/2007 |
| JP | 2009-021467 A | 1/2009 |
| JP | 2009-224443 A | 10/2009 |
| WO | 2009/113737 A1 | 9/2009 |

* cited by examiner

PART-MOUNTING, INSPECTING AND REPAIRING METHOD

TECHNICAL FIELD

The present invention relates to a part-mounting system and a part-mounting method for mounting parts on a substrate printed with solder.

BACKGROUND ART

A part-mounting system includes a solder printing portion made up of a solder printer that prints a substrate with solder and a part-mounting portion made up of one or a plurality of part-mounting machines that mount parts on the substrate printed with solder by means of the solder printing portion. The substrate having finished undergoing part-mounting in the part-mounting portion is sent to a reflow furnace, where the substrate undergoes solder reflow. The substrate having finished undergoing solder reflow is subjected to appearance check. A repair-requiring location found through the appearance check is manually repaired by a worker, like an operator (see; for instance, Patent Document 1). The word "repair-requiring location" includes a defective location caused as a result of a part being mounted outside a target mounting position, as well as including a location caused as a result of a part mounted at a target mounting position on a substrate needing reset because of its defective mounted state.

RELATED ART DOCUMENT

Patent Document

Patent Document 1: JP-A-2005-286015

DISCLOSURE OF THE INVENTION

Problem that the Invention is to Solve

However, when a part is extremely small or requires highly, positionally accurate attachment, there is a case where it is impossible to assure quality of a product by manual mounting operation performed by an operator, or the like. For this reason, even when a repair-requiring location is found, there will be no alternative way but to discard a substrate if the operator, or the like, cannot manually perform required repair operation. A percentage of a non-defective substrate is eventually deteriorated, which in turn raises a problem of an increase in production cost.

Accordingly, the present invention aims at a part-mounting system and a part-mounting method that make it possible to mount a part at a repair-requiring location without failure even when a part is extremely small and enhance a percentage of a non-defective substrate rate.

Means for Solving the Problem

A part-mounting system of a first aspect of the invention includes a solder print portion that prints a loaded substrate with solder; a part-mounting portion that mounts parts on the substrate printed with the solder by the solder print portion; a repair-requiring location inspection portion that inspects whether or not a repair-requiring location exists on the substrate on which the parts are mounted by the part-mounting portion, so that the repair-requiring location is identified when the repair-requiring location exists on the substrate; and a repair-requiring location display portion for displaying the repair-requiring location identified by the repair-requiring location inspection portion. The system further includes a parts-missing location inspection portion that makes an inspection as to whether or not a parts-missing location exists on the substrate that is reloaded between the solder print portion and the part-mounting portion after having undergone manual repair of the repair-requiring location displayed on the repair-requiring location display portion by the worker, so that the parts-missing location is identified when the parts-missing location exists on the substrate, wherein the part-mounting portion mounts parts on the parts-missing location on the substrate identified by the parts-missing location inspection portion.

A part-mounting system of a second aspect of the invention is based on the part-mounting system of the first aspect of the invention, and the parts-missing location inspection portion makes an inspection as to whether or not a bonded state of the solder at the parts-missing location on the substrate reloaded between the solder print portion and the part-mounting portion is defective, and the part-mounting portion has an additional solder feed portion for additionally feeding solder to a location at which the bonded state of the solder is determined to be defective.

A part-mounting system of a third aspect of the invention is based on the part-mounting system of the first or second aspect of the invention, and the parts-missing location inspection portion makes an inspection as to whether or not a print status of solder on the substrate achieved immediately after the substrate has been printed with solder by the solder print portion is defective.

A part-mounting method of a fourth aspect of the invention includes a solder print process of printing a loaded substrate with solder; a part-mounting process of mounting parts on the substrate printed with the solder in the solder print process; a repair-requiring location inspection process of inspecting whether or not a repair-requiring location exists on the substrate on which the parts are mounted in the part-mounting process and identifying the repair-requiring location when the repair-requiring location exists on the substrate; and a repair-requiring location display process of displaying the repair-requiring location identified in the repair-requiring location inspection process. Under the method, there are performed processing pertaining to a parts-missing location inspection process of making an inspection as to whether or not a parts-missing location exists on the substrate that has undergone manual repair of the repair-requiring location displayed in the repair-requiring location display process by a worker, so that the parts-missing location is identified when the parts-missing location exists on the substrate; and processing pertaining to a parts-missing location part-mounting process of mounting parts at the parts-missing location on the substrate identified in the parts-missing location inspection process.

Advantage of the Invention

In the invention, the parts-missing location inspection portion makes an inspection as to whether or not a parts-missing location exists on the substrate reloaded between the solder print portion and the part-mounting portion after having undergone manual repair by a worker, like an operator, in connection with the repair-requiring location found through inspection performed by the repair-requiring location inspection portion after mounting of the parts. When the parts-missing location on the substrate is found, the parts-missing location is identified. Subsequently, the part-mounting portion mounts parts at the parts-missing location on the thus-identified substrate. Therefore, the worker, like an operator, does not need to mount the parts at the repair-requiring location. Laborious operation also becomes obviated. Further, even when the parts are extremely small, the parts can be mounted to the repair-requiring location with reliability, so that a percentage of a non-defective substrate can be enhanced.

EMBODIMENT OF THE INVENTION

Figure 1:
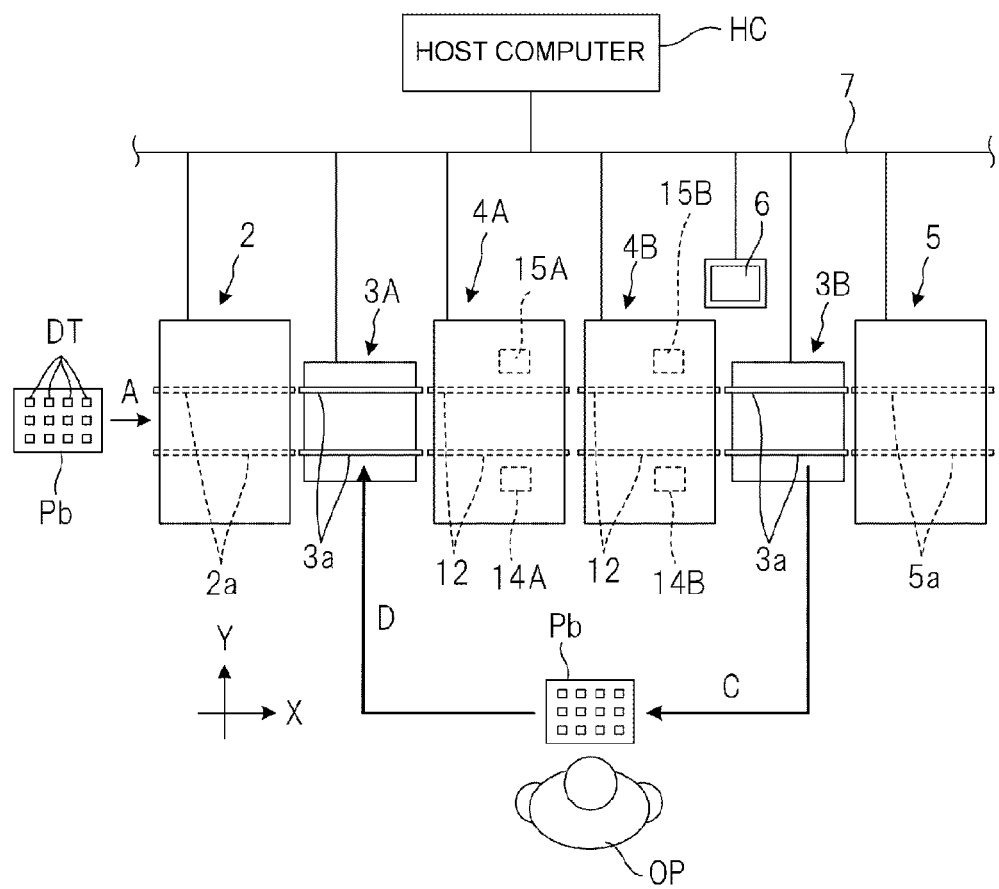
FIG. 1 is a general schematic view of a part-mounting system of an embodiment of the present invention.

An embodiment of the present invention is hereunder described by reference to the drawings. In FIG. 1, a part-mounting system 1 of the embodiment is built from a solder printer 2, a first substrate conveyor machine 3A, a first part-mounting machine 4A, a second part-mounting machine 4B, a second substrate conveyor machine 3B, and a reflow furnace 5, all of which are arranged as a plurality of machines for mounting parts in this sequence in a direction in which a substrate Pb is conveyed. A display unit 6 is disposed in a vicinity of the second substrate conveyor machine 3B. These machines are interconnected by means of a LAN cable 7 of a local area network (LAN) connected to a host computer HC, to thus be able to exchange information with one another. In the part-mounting system 1, for the sake of explanation, a direction in which the substrate Pb is conveyed is hereunder taken as an X-axis direction, and a horizontal in-plane direction orthogonal to the X-axis direction is hereunder taken as a Y-axis direction. Further, a vertical direction is taken as a Z-axis direction.

In FIG. 1, the solder printer 2 receives the substrate Pb loaded in a direction of arrow A shown in FIG. 1 with a substrate track 2a, conveys the thus-received substrate in the X-axis direction, positions the thus-conveyed substrate at a working location, and subsequently prints electrodes DT provided on the substrate Pb with solder (a solder print process). After printing the electrodes DT on the substrate Pb with solder is completed, the substrate track 2a conveys the substrate Pb to the first substrate conveyor machine 3A serving as a downstream apparatus. As mentioned above, in the part-mounting system 1 of the embodiment, the solder printer 2 serves as a solder printing portion that prints the loaded substrate Pb with solder.

In FIG. 1, the first substrate conveyor machine 3A and the second substrate conveyor machine 3B have the same configuration. Each of the substrate conveyor machines receives the substrate Pb conveyed from an upstream apparatus (i.e., the solder printer 2 for the first substrate conveyor machine 3A and the second part-mounting machine 4B for the second substrate conveyor machine 3B) by means of a substrate track 3a, conveys the thus-received substrate in the X-axis direction, and further conveys the substrate to a corresponding downstream apparatus (the first part-mounting machine 4A for the first substrate conveyor machine 3A and the reflow furnace 5 for the second substrate conveyor machine 3B).

The first part-mounting machine 4A and the second part-mounting machine 4B have the same configuration (differ from each other in terms of operation), and a configuration of the first part-mounting machine 4A is described as a typical configuration of the part-mounting machine.

Figure 2:
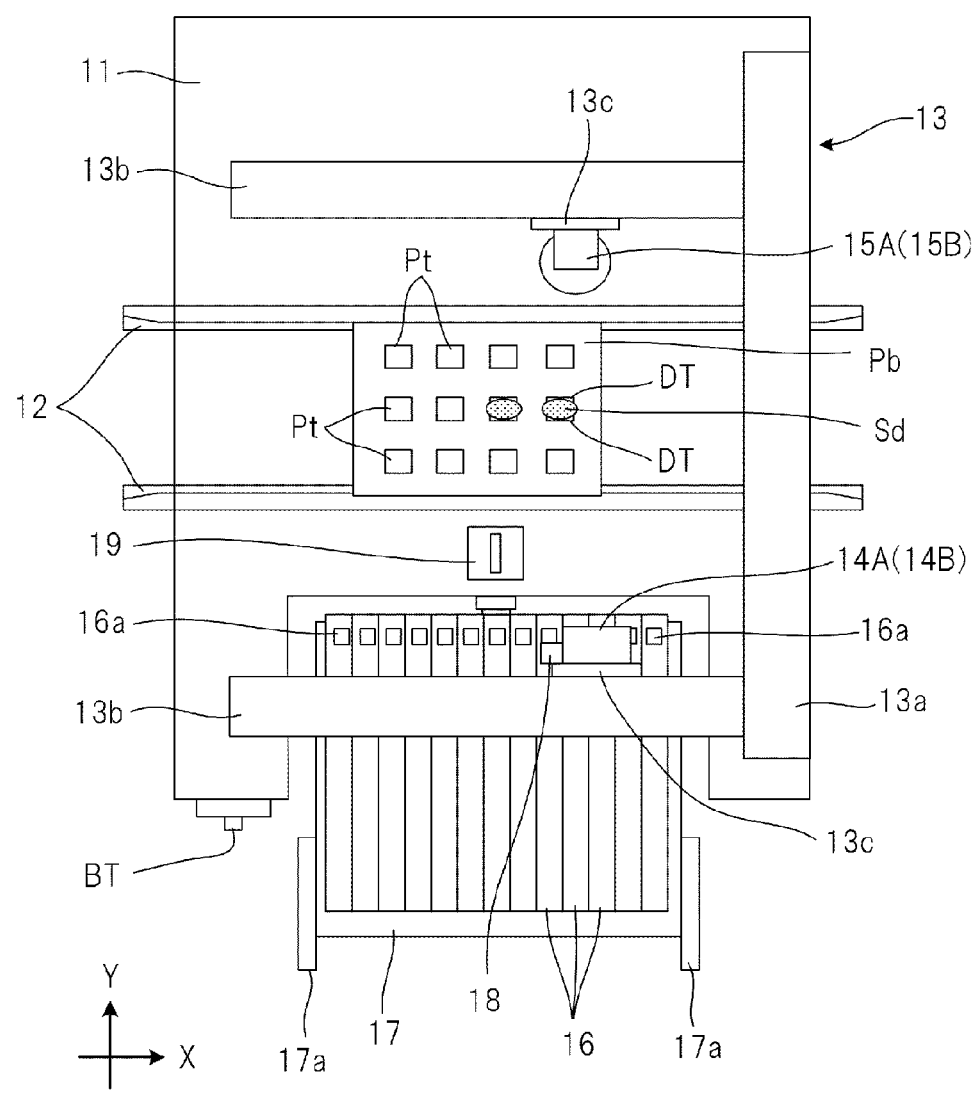
FIG. 2 is a plan view of a part-mounting machine making up the part-mounting system of the embodiment of the present invention.
Figure 3:
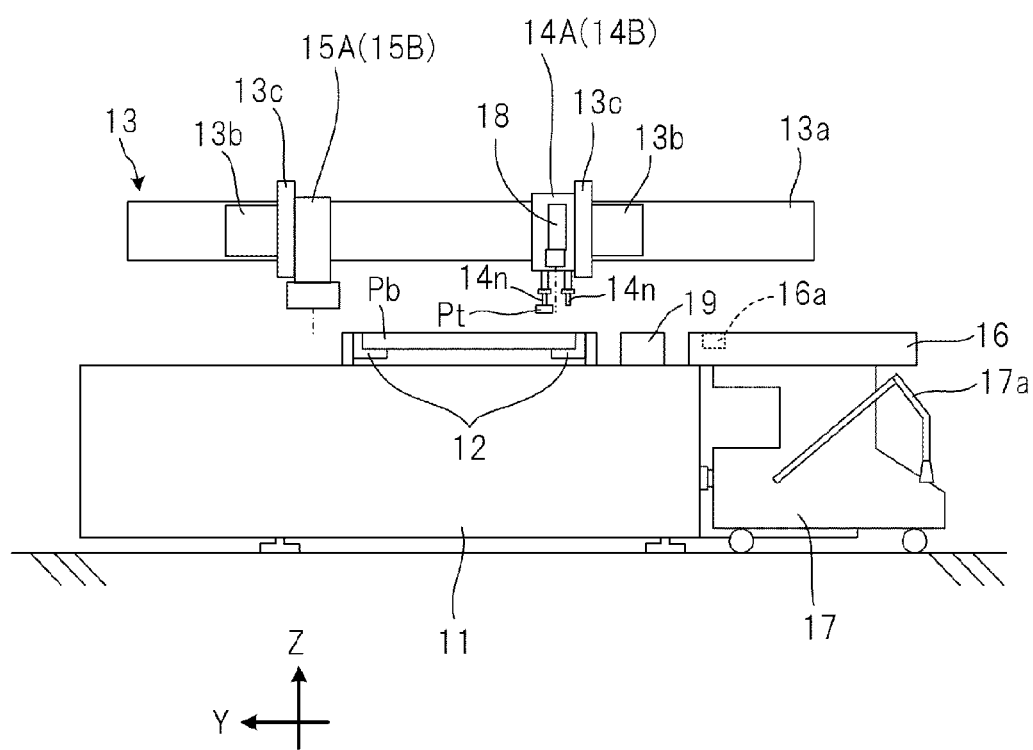
FIG. 3 is a side view of the part-mounting machine making up the part-mounting system of the embodiment of the present invention.

In FIGS. 2 and 3, the first part-mounting machine 4A is equipped with a substrate track 12 laid on a bed 11 and receives the substrate Pb conveyed from the first substrate conveyor machine 3A (the first part-mounting machine 4A for the second part-mounting machine 4B) that serves as an upstream apparatus, and positions the substrate at a working location (a location shown in FIG. 2) at the center of the bed 11.

An XY robot 13 is placed on the bed 11. By means of the XY robot 13, a mounting head 14A (a mounting head in the second part-mounting machine 4B is assigned reference numeral 14B) and an inspection camera 15A (an inspection camera in the second part-mounting machine 4B is assigned reference numeral 15B) are moveable independently of each other. The XY robot 13 is built from a Y-axis table 13a provided so as to extend in the Y-axis direction, two X-axis tables 13b that extend in the X-axis direction, that are supported at one end thereof by means of the Y-axis table 13a, and that are provided so as to be movable along the Y-axis table 13a (i.e., the Y-axis direction), and two movable stages 13c that are movable along the respective X-axis tables 13b (i.e., in the X-axis direction). The mounting head 14A on one of the movable stages 13c and the inspection camera 15A on the other movable stage 13c are attached separately from each other.

In FIG. 3, a plurality of downwardly-extending pickup nozzles 14n are provided at a lower end of the mounting head 14A. Each of the pickup nozzles 14n can be elevated and lowered with respect to the mounting head 14A and can be turned around a vertical axis (the Z axis). The inspection camera 15A is mounted to the movable stage 13c with an imaging field of view downwardly oriented.

In FIGS. 2 and 3, a plurality of parts feeders (parts feeders) 16 that feed parts Pt (FIGS. 2 and 3) to the mounting head 14A are arranged side by side in the X-axis direction and on one side along which the mounting head 14A is disposed, of both sides of the bed 11 opposing each other in the Y-axis direction with the substrate track 12 sandwiched therebetween. The plurality of parts feeders 16 are held by a carriage 17 removably attached to the bed 11. The plurality of parts feeders 16 can be collectively attached to the bed 11 by means of attaching the carriage 17 to the bed 11. The carriage 17 can move over a floor by means of an operator OP (FIG. 1) operating a pair of wheels 17a. The respective parts feeders 16 attached to the bed 11 consecutively feed parts Pt to parts feed ports 16a formed at respective ends of the parts feeders close to the substrate track 12.

In FIGS. 2 and 3, of the two movable stages 13c provided in the XY robot 13, the movable stage 13c equipped with the mounting head 14A has a substrate camera 18 whose imaging field of view is downwardly oriented. A parts camera 19 whose imaging field of view is upwardly oriented is set in one lateral area where the mounting head 14A is disposed, of both lateral areas of the substrate track 12 in the Y-axis direction.

Figure 4:
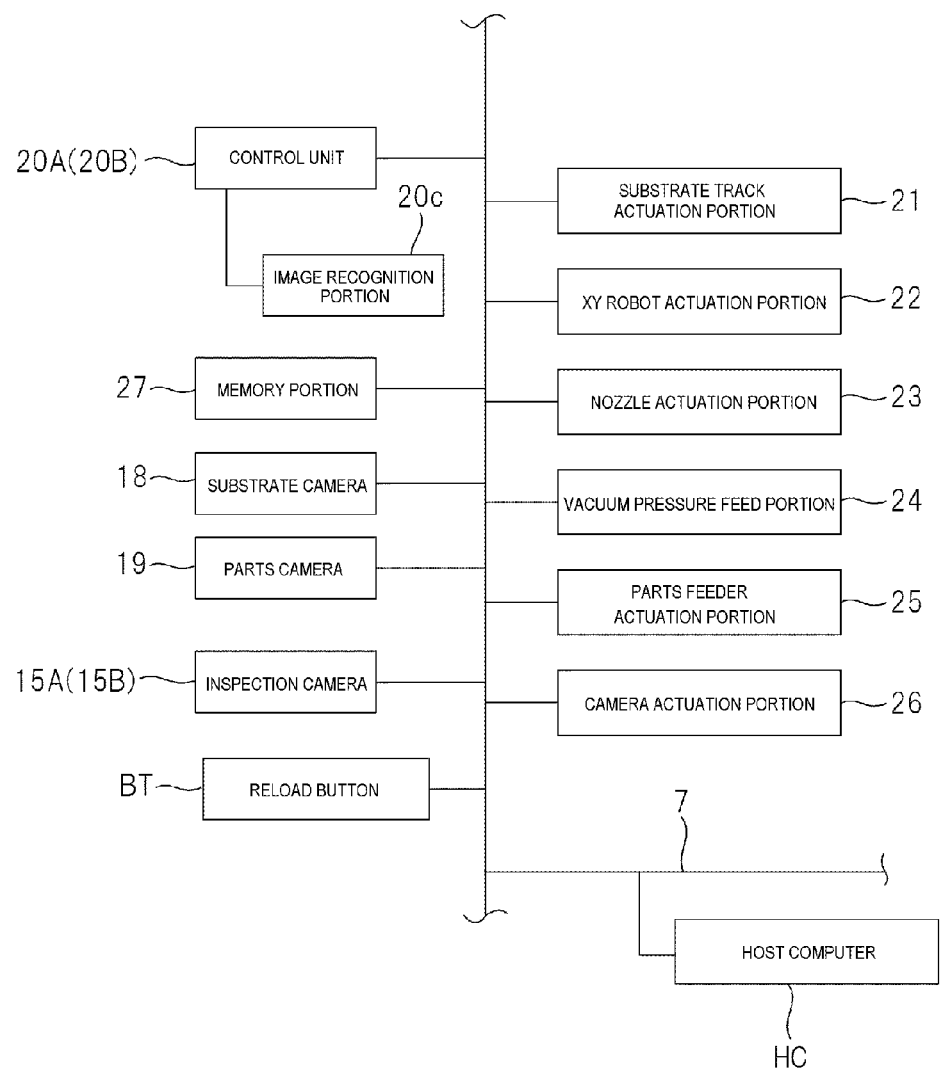
FIG. 4 is a portion diagram showing a control system of the part-mounting machine of the embodiment of the present invention.

In FIG. 4, a control unit 20A (a control unit provided in the second part-mounting machine 4B is given reference numeral 20B) provided in the first part-mounting machine 4A activates a substrate track actuation portion 21 built from an unillustrated actuator, or the like, for actuating the substrate track 12, thereby conveying and positioning the substrate Pb. Further, the control unit activates an YX robot drive unit 22 built from an unillustrated actuator for actuating the XY robot 13, thereby actuating the mounting head 14A and the inspection camera 15A within a horizontal plane. Moreover, the control unit 20A activates a nozzle actuation portion 23 built from an unillustrated actuator, or the like, for actuating the respective pickup nozzles 14n, thereby elevating or lowering the respective pickup nozzles 14n with respect to the mounting head 14A and turning the respective pickup nozzles around the vertical axis (the Z axis). The control unit also activates a vacuum pressure feed portion 24 built from an unillustrated actuator, or the like, for feeding vacuum pressure into the respective pickup nozzles 14n, thereby bringing interiors of the respective pickup nozzles 14n into a vacuum state. Alternatively, the vacuum state of the respective pickup nozzles is destroyed, thereby letting the respective pickup nozzles 14n pick up corresponding parts P or release the picked-up parts Pt.

The control unit 20A activates a parts feeder actuation portion 25 built from an unillustrated actuator, or the like, for actuating the respective parts feeders 16, thereby letting the respective parts feeders 16 perform operation for feeding parts to the respective parts feed ports 16a and activates a camera drive portion 26 (FIG. 4), thereby controlling imaging operation of the inspection camera 15A, the substrate camera 18, and the parts camera 19. Image data captured by means of imaging operation of the inspection camera 15A, the substrate camera 18, and the parts camera 19 are captured and stored into a memory portion 27. Further, the control unit 20A is connected to the host computer HC by way of the LAN cable 7 and can transmit and receive data to and from the host computer HC.

Operation of the first part-mounting machine 4A and operation of the second part-mounting machine 4B are now described. Upon detection of the substrate Pb (the substrate Pb printed with solder by the solder printer 2) conveyed from the first substrate conveyor machine 3A, the control unit 20A of the first part-mounting machine 4A activates the substrate track 12, to thus receive the substrate Pb, convey the thus-received substrate in the X-axis direction, and position the substrate at the working location. The substrate camera 18 (the mounting head 14A) is moved to an elevated position above a substrate mark (not shown) provided on the substrate Pb, to thus capture an image of the substrate mark. An image recognition portion 20c (FIG. 4) recognizes the thus-acquired image of the substrate mark through image recognition, thereby determining a positional displacement of the substrate Pb (a positional displacement from a normal working location of the substrate Pb). Alternatively, the inspection camera 15A may capture the image of the substrate mark.

After determined the positional displacement of the substrate Pb, the control unit 20A of the first part-mounting machine 4A moves the inspection camera 15A to an elevated position above the substrate Pb, thereby capturing images of locations on the substrate Pb. The memory portion 27 captures resultant image data, and the image recognition portion 20c recognizes the images, thereby determining whether or not a print status of solder Sd (see FIG. 2 and FIG. 5) on the electrodes DT achieved immediately after the solder has been printed by the solder printer 2 is defective (a solder print status inspection process). When a location including a defective print status of the solder Sd on the electrodes DT (a defective location) is found, unillustrated mark provision means is activated, to thus provide the defective location with a print failure mark. Further, positional information about the defective location is stored in the memory portion 27. The positional information about the defective location is transmitted to the host computer HC by way of the LAN cable 7. The host computer HC transmits to the control unit 20B of the second part-mounting machine 4B the positional information about the location where the print status of the solder Sd is defective transmitted from the first part-mounting machine 4A.

When a defective location on the substrate Pb is not found as a result of performance of processing pertaining to the solder print status inspection process, the control unit 20A of the first part-mounting machine 4A mounts parts Pt on a location on the substrate Pb where the first part-mounting machine 4A takes on the task of mounting the part Pt (a part-mounting process). Processing pertaining to the part-mounting process is performed by repeating operation for feeding parts Pt to the respective parts feeders 16, actuating the mounting head 14A, and picking up the parts Pt from the parts feeders 16 and operation for releasing the picked-up parts Pt on the respective electrodes DT on the substrate Pb printed with solder Sd. In the meantime, when a defective location on the substrate Pb is found, the substrate track 12 is activated without mounting the parts Pt on the substrate Pb, thereby conveying the substrate Pb to the second part-mounting machine 4B that is a downstream apparatus.

An explanation is now given to procedures in the part-mounting process from a step of sucking (picking up) the part Pt to a step of releasing the part Pt on the substrate Pb (mounting the parts on the substrate Pb). The Control unit 20A first moves the mounting head 14A to an elevated position above the parts feed port 16a of the parts feeder 16; lowers and elevates the pickup nozzle 14n with respect to the mounting head 14A; and brings the interior of the pickup nozzle 14n into a vacuum state when the pickup nozzle 14n has contacted an upper surface of the part Pt, to thus let the pickup nozzle 14n pick up the part Pt. The part Pt is thereby picked up by the mounting head 14A (i.e., the pickup nozzle 14n).

The control unit 20A moves the mounting head 14A after the mounting head has picked up the part Pt, thereby letting the part Pt stay at an elevated position immediately above the parts camera 19 and causing the parts camera 19 to capture an image of the part Pt. The control unit 20A causes the memory portion 27 to acquire image data pertaining to the part Pt captured by the parts camera 19. The image recognition portion 20c recognizes an image, to thus check whether or not an anomaly (a deformation, a defect, or the like) exists in the part Pt and calculate a positional displacement of the part Pt from the pickup nozzle 14n (a pickup displacement).

Figure 5:
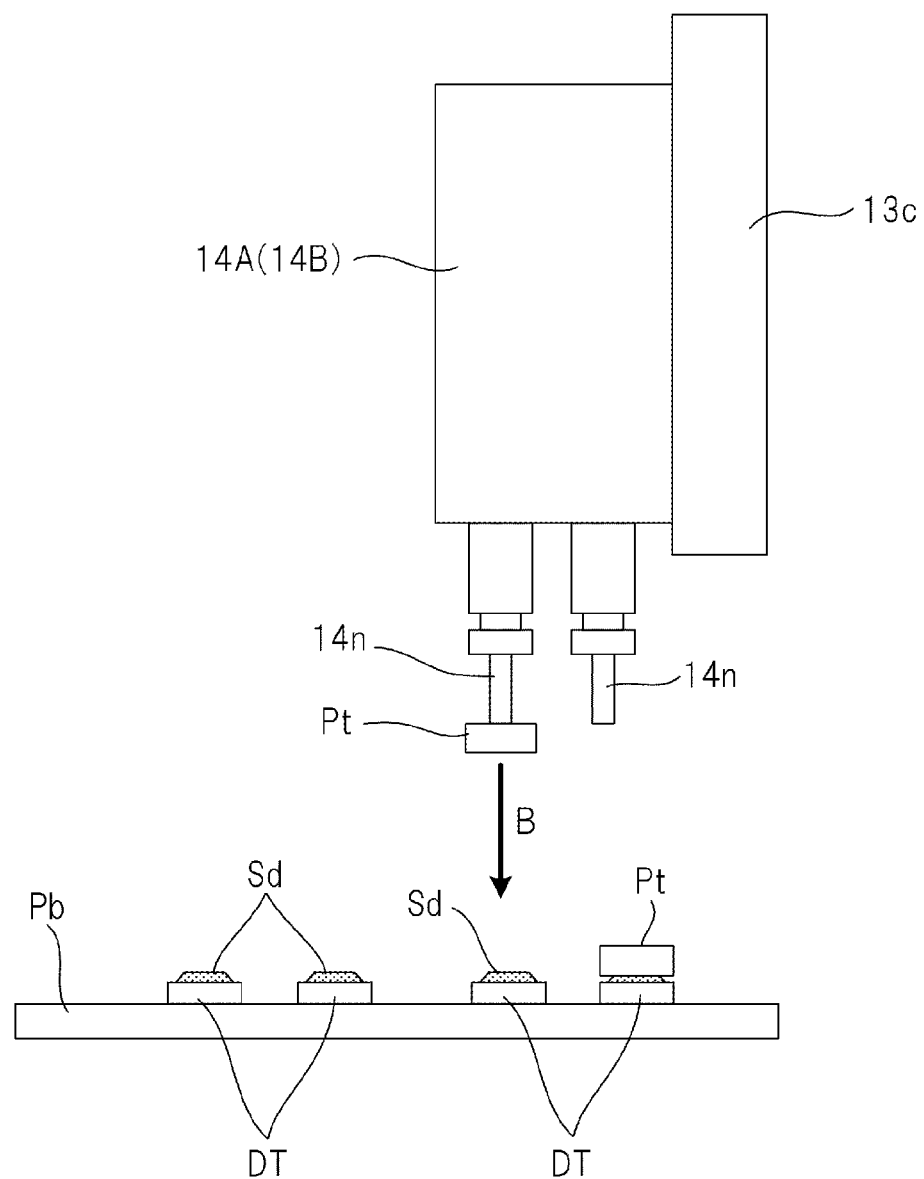
FIG. 5 is a view for explaining operation for mounting parts on a substrate performed by a mounting head in the part-mounting machine of the embodiment of the present invention.

After the image of the part Pt has been recognized, the control unit 20A moves the mounting head 14A in such way that the part Pt picked-up by the pickup nozzle 14n comes to an elevated position immediately above a target mounting position (a position where the electrode DT is mounted) on the substrate Pb (FIG. 5). The pickup nozzle 14n is lowered (as designated by arrow B shown in FIG. 5) and elevated with respect to the mounting head 14A (14B). When the part Pt contacted the electrode DT, the vacuum state of the interior of the pickup nozzle 14n is destroyed. The part Pt picked-up by the pickup nozzle 14n is thereby released, whereupon the part Pt is released from the pickup nozzle 14n and mounted on the electrode DT of the substrate Pb. When the part Pt is mounted on the electrode DT, a correction (including rotational correction) is made to the position of the pickup nozzle 14n with respect to the substrate Pb such that the previously-determined positional displacement of the substrate Pb and the pickup displacement of the part Pt are corrected.

After having mounted parts Pt to all of the locations on the substrate Pb where the parts Pt are to be mounted (locations where the first part-mounting machine 4A takes the task of mounting the parts Pt), the first part-mounting machine 4A activates the substrate track 12, thereby 10 conveying the substrate Pb to the second part-mounting machine 4B that is a downstream apparatus.

Upon detecting that the substrate Pb has been conveyed from the first part-mounting machine 4A, the control unit 20B of the second part-mounting machine 4B activates the substrate track 12 so as to receive the substrate Pb, convey the thus-received substrate in the X-axis direction, and position the substrate at the working location. It may also be possible to determine positional displacement of the substrate Pb through procedures similar to those employed by the first part-mounting machine 4A (the inspection camera 15B can capture an image of the substrate mark).

After having determined the positional displacement of the substrate Pb, the control unit 20B of the second part-mounting machine 4B performs processing pertaining to the foregoing part-mounting process through the procedures similar to those employed by the first part-mounting machine 4A. When the substrate Pb is not a substrate including a location found to have a defective print status by the first part-mounting machine 4A, the control unit 20B of the second part-mounting machine 4B mounts the part Pt at a location on the substrate Pb where the second part-mounting machine 4B takes the task of mounting the part Pt. In the meantime, when the substrate Pb is a substrate including a location found to have a defective print status by the first part-mounting machine 4A, operation for mounting the part Pt on the substrate Pb is not performed, and the substrate Pb is conveyed to the second substrate conveyor machine 3B that is a downstream apparatus. Information about whether or not the substrate Pb received from the first part-mounting machine 4A is a substrate including a location found to have a defective print status by the first part-mounting machine 4A can be received from the host computer HC as mentioned previously.

After having mounted the parts Pt at all of the locations where the parts Pt are to be mounted (locations where the second part-mounting machine 4B takes the task of mounting the parts Pt), the control unit 20B of the second part-mounting machine 4B moves the inspection camera 15B to an elevated position above the substrate Pb, and images of the respective locations on the substrate Pb are captured, and resultant image data are taken into the memory portion 27. The image recognition portion 20c subjects the image data to image recognition, thereby checking whether or not a repair-requiring location exists on the substrate Pb. When a repair-requiring location is found to exist on the substrate Pb as a result of the check, the repair-requiring location is identified (a repair-requiring location inspection process). Information (a position and an image) about the thus-identified repair-requiring location is transmitted to the host computer HC, whereupon the substrate Pb is conveyed to the second substrate conveyor machine 3B that is a downstream apparatus. Upon receipt of the information about the repair-requiring location from the second part-mounting machine 4B, the host computer HC causes the display unit 6 to display the information (the position and the image) of the repair-requiring location on the substrate Pb according to the information (a repair-requiring location display process).

In addition to including a location where the part Pt mounted at the target mounting position on the substrate Pb requires reset because of its defective mounted state, the word "repair-requiring location" includes a parts-missing location where the part Pt is not mounted at the target mounting position.

When the substrate Pb conveyed from the substrate track 12 of the second part-mounting machine 4B to the second substrate conveyor machine 3B is printed with a print failure mark, the worker (hereinafter referred to as an "operator OP"), like an operator OP, picks up the substrate Pb from the second substrate conveyor machine 3B. In order to reprint a print failure location on the substrate Pb with the solder Sd, the solder Sd adhering to the print failure location is wiped off, or the like, and the substrate is subsequently loaded (re-loaded) into the solder printer 2.

If the display unit 6 shows a repair-requiring location during the course of the substrate Pb being conveyed from the substrate track 12 of the second part-mounting machine 4B, the operator Op, or the like, will determine that the substrate Pb includes a repair-requiring location. The operator picks up the substrate Pb from a production line of the part-mounting system 1 (directly from the second substrate conveyor machine 3B) (designated by arrow C in FIG. 1), and the repair-requiring location on the substrate Pb displayed on the display unit 6 is manually repaired. The operator OP, or the like, can at this time perform required operation while viewing an image that represents the repair-requiring location and that is displayed on the display unit 6; namely, visually checking (indirectly visually confirming by way of the display unit 6) a position and a defective state of the location on the substrate Pb to be repaired. The operator OP, or the like, does not need to make repairs, like mounting a part Pt to a parts-missing location where a part Pt is not mounted or reprinting with solder Sd a print failure location where the solder Sd is not provided. The essential requirement for the operator is to make a repair, like a correction to positional displacement of the part Pt.

When repair of the repair-requiring location is completed, the operator OP, or the like, reloads the substrate Pb having finished undergone repair (as designated by arrow D shown in FIG. 1) into the first substrate conveyor machine 3A situated between the solder printer 2 and the first part-mounting machine 4A, in order to return the substrate Pb into the production line of the part-mounting system 1. The operator OP, or the like, at this time actuates a reload button BT (FIG. 2 and FIG. 4) provided on the first part-mounting machine 4A.

The control unit 20A of the first part-mounting machine 4A recognizes the substrate Pb conveyed immediately after actuation of the reload button BT as a reloaded substrate Pb. Since the substrate is already inspected by the solder printer 2 in connection with a print status of the solder Sd, processing pertaining to the foregoing solder print status inspection process (inspection of a print status of the solder Sd on all of the electrodes DT on the substrate Pb) is not performed. The substrate Pb (the substrate Pb manually repaired by the operator OP, or the like, in relation to the repair-requiring location displayed in the repair-requiring location display process) is subjected to an inspection about whether or not a parts-missing location exists. When a parts-missing location exists on the substrate, the parts-missing location is identified (a parts-missing location inspection process). When a parts-missing location exists (found) as a result of performance of processing pertaining to the parts-missing location inspection process, positional information about the parts-missing location is stored in the memory portion 27.

In the parts-missing location inspection process, the control unit 20A of the first part-mounting machine 4A performs an inspection about whether or not a bonded state of solder Sd to the parts-missing location is defective, as well as identifying the parts-missing location. Solder Sd is additionally fed to a location determined to be defectively printed with the solder Sd among the parts-missing locations (an additional solder feed process).

Figure 6:
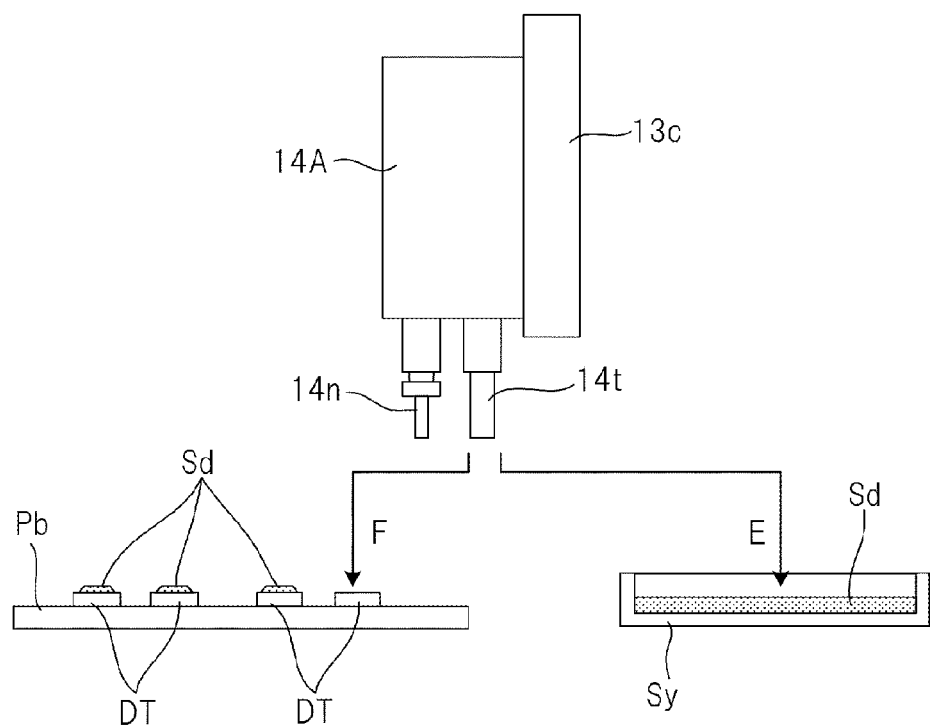
FIG. 6 is a view for explaining operation for additionally feeding solder to the substrate performed by the mounting head provided in the part-mounting machine of the embodiment of the present invention.

During additional feed of the solder Sd, some of the plurality of pickup nozzles 14n attached to the mounting head 14A are first replaced with transfer pins 14t that are pin-shaped members for transferring solder Sd as shown in FIG. 6. The mounting head 14A is moved to an elevated position above a storage container Sy for the solder Sd (illustrated in only FIG. 6 and not in FIGS. 2 and 3) provided on the bed 11 of the first part-mounting machine 4A. The transfer pins 14t are lowered (as designated by arrow E in FIG. 6) and elevated with respect to the mounting head 14A, thereby letting the solder Sd in the storage container Sy adhere to lower ends of the transfer pins 14t. The mounting head 14A is moved to the elevated position above the substrate Pb, and the transfer pins 14t are lowered (as designated by arrow F in FIG. 6) and elevated with respect to the mounting head 14A, thereby pressing the transfer pins 14t against the electrodes DT at locations on the substrate Pb where the bonded state of the solder Sd is defective. The solder Sd is thereby additionally fed onto the electrodes DT, so that the defective bonded state of the solder Sd on the electrodes DT is resolved. Alternatively, the transfer pins 14t may also be attached from the beginning rather than being replaced with the pickup nozzles 14n attached to the mounting head 14A as mentioned above.

In many cases, most of the defective locations correspond to a location that is well printed with the solder Sd by the solder printer 2 but where the first part-mounting machine 4A or the second part-mounting machine 4B failed to mount the part Pt, so that the part Pt is temporarily brought into contact with the solder Sd but is now faintly printed with the solder or deficient in solder. A defective bonded state of the solder Sd can be mostly resolved by additional feed of the solder Sd to the transfer pins 14t, such as those mentioned above.

From above, even in the case of a substrate Pb given a print failure mark among the substrates Pb conveyed to the second substrate conveyor machine 3B, if the operator OP determines from a result of inspection of the location on the substrate Pb where the print status of the solder Sd is defective that the defective bonded state of the solder Sd can be resolved by additional feed of the solder Sd by means of the transfer pins 14t, the substrate Pb may also be reloaded into the first part-mounting machine 4A rather than into the solder printer 2.

The control unit 20A of the first part-mounting machine 4A additionally feeds the solder Sd to a location where the bonded state of the solder Sd is defective, among the parts-missing locations, as mentioned above. The control unit mounts the part Pt to the parts-missing location where the first part-mounting machine 4A takes the task of mounting the part Pt, among the parts-missing locations on the substrate Pb (a parts-missing location part-mounting process).

After having finished mounting the parts Pt to the parts-missing locations, the first part-mounting machine 4A conveys the substrate Pb to the second part-mounting machine 4B that is a downstream apparatus. During conveyance of the substrate Pb, the first part-mounting machine 4A transmits, by way of the LAN cable 7, to the host computer HC positional information about a parts-missing location (hereinafter referred to as "parts-missing information") where the second part-mounting machine 4B takes the task of mounting the part Pt., among the parts-missing locations on the substrate Pb, in connection with information (hereinafter referred to as "reload information") meaning that the substrate Pb is a reloaded substrate Pb. The host computer HC transmits the parts-missing information transmitted from the first part-mounting machine 4A to the control unit 20B of the second part-mounting machine 4B.

During conveyance of the substrate Pb from the first part-mounting machine 4A, the control unit 20B of the second part-mounting machine 4B recognizes the substrate Pb as a reloaded substrate Pb when received reload information from the first part-mounting machine 4A. According to the parts-missing information received along with the reload information, the control unit mounts the parts Pt at the location where the second part-mounting machine 4B takes the task of mounting parts Pt, among the parts-missing locations on the substrate Pb (the parts-missing location part-mounting process). After mounting the parts Pt on the parts-missing locations is completed, processing pertaining to the repair-requiring location inspection process is again performed as mentioned previously, thereby conveying the substrate Pb to the second substrate conveyor machine 3B that is a downstream apparatus.

As mentioned above, the mounting head 14A and the control unit 20A of the first part-mounting machine 4A and the mounting head 14B and the control unit 20B of the second part-mounting machine 4B act in the part-mounting system 1 as a compound mounting portion that mounts the parts Pt on the substrate Pb printed with the solder Sd by the solder printer 2 that is a solder print portion.

The inspection camera 15B and the control unit 20B in the second part-mounting machine 4B acts as a repair-requiring location inspection portion in the component mounting system 1. The repair-requiring location inspection portion makes an inspection about whether or not a repair-requiring location exists on the substrate Pb on which the parts Pt are mounted by the part-mounting portion. When a repair-requiring location exists on the substrate Pb, the repair-requiring location inspection portion locates the repair-requiring location. The display unit 6 acts as a repair-requiring location display portion that displays the repair-requiring location identified by the repair-requiring location inspection portion.

The inspection camera 15A and the control unit 20A in the first part-mounting machine 4A act as a parts-missing location inspection portion in the part-mounting system 1. The parts-missing location inspection portion performs an inspection about whether or not a parts-missing location exists on the substrate Pb that has undergone manual repair by the worker, like an operator OP, in connection with the repair-requiring location displayed on the repair-requiring location inspection portion and that is reloaded between the solder print portion and the part-mounting portion. (i.e., the solder printer 2 and the first part-mounting machine 4A). Further, when a parts-missing location exists on the substrate Pb, the parts-missing location inspection portion identifies the parts-missing location.

Figure 7:
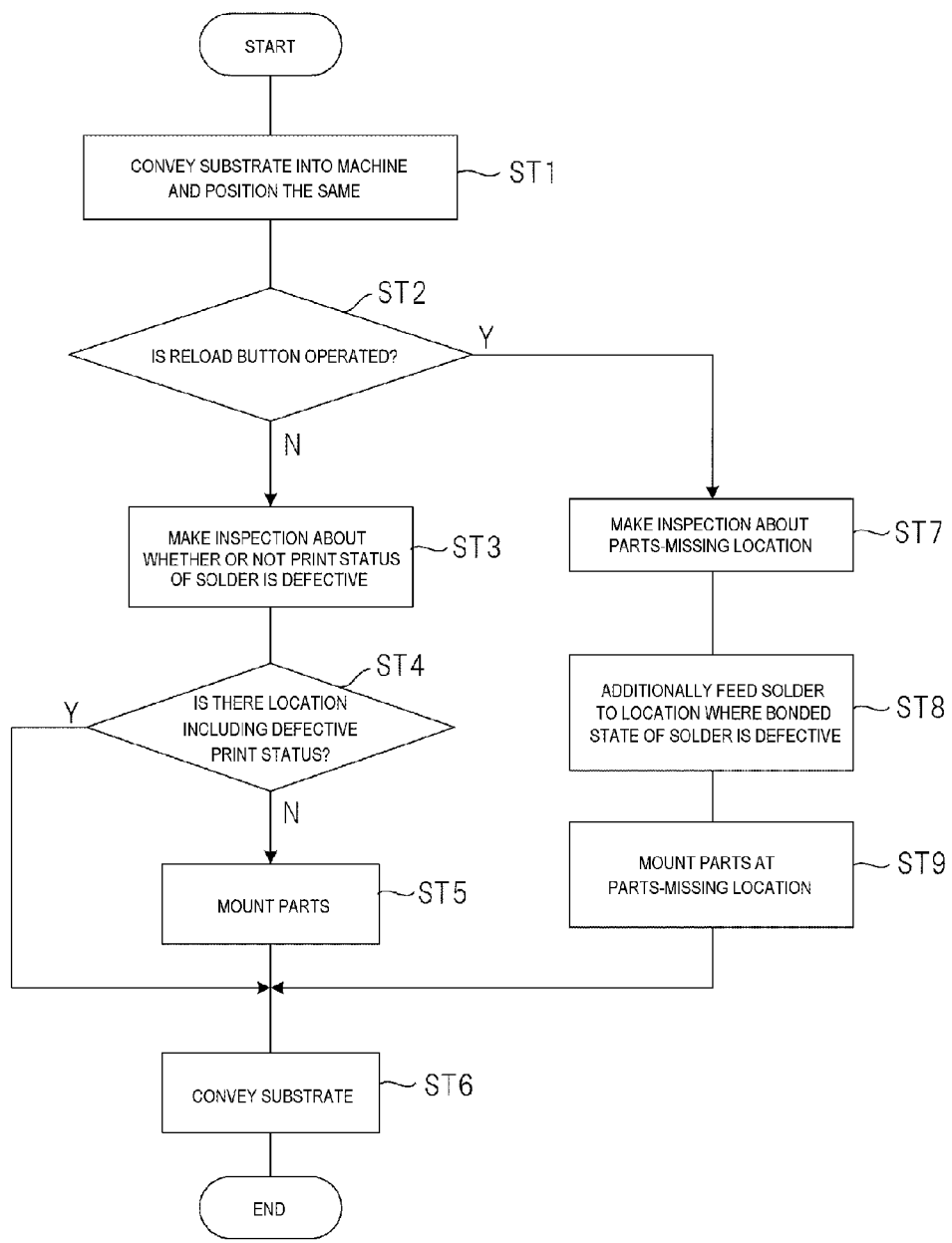
FIG. 7 is a portion diagram showing procedures of part-mounting operation performed by a first part-mounting machine of the embodiment of the present invention.
Figure 8:
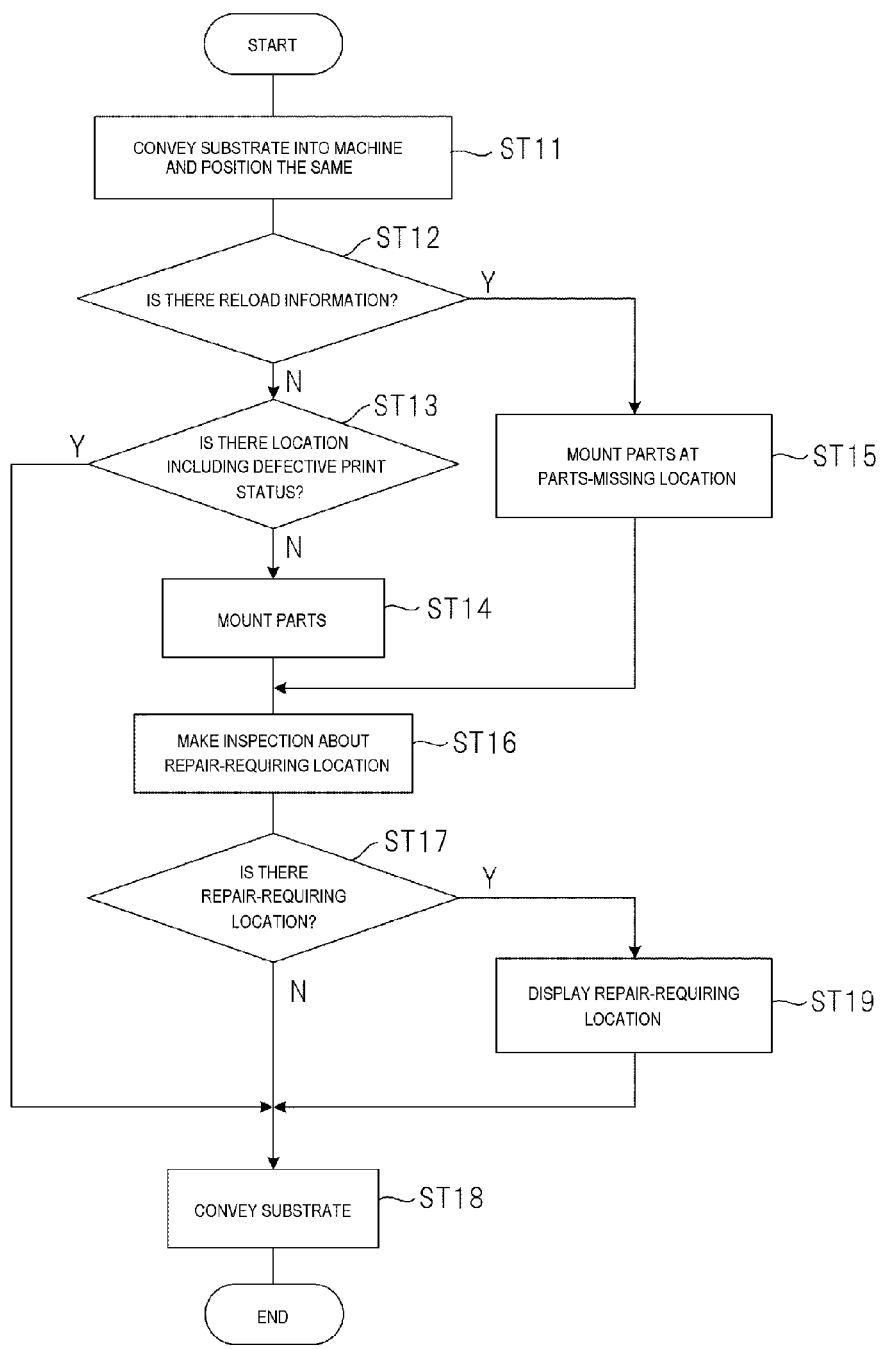
FIG. 8 is a portion diagram showing procedures of part-mounting operation performed by a second part-mounting machine of the embodiment of the present invention.

FIG. 7 and FIG. 8 show operation procedures of the first part-mounting machine 4A and operation procedures of the second part-mounting machine 4B in the form of flowcharts. FIG. 7 shows the operation procedures of the first part-mounting machine 4A, and FIG. 8 shows the operation procedures of the second part-mounting machine 4B.

In FIG. 7, the control unit 20A of the first part-mounting machine 4A conveys the substrate Pb delivered from the upstream into the machine and positions the same (step ST1). Subsequently, the control unit determines whether or not the reload button BT is actuated (step ST2). As a consequence, when the reload button BT is detected not to have been actuated, the substrate Pb is determined not to be reloaded (i.e., determined to be immediately after having been conveyed out from the solder printer 2). An inspection is made as to whether or not the print status of the solder Sd is defective by use of the inspection camera 15A (step ST3, the solder print status inspection process), and a determination is made as to whether or not a defective print status exists on the substrate Pb (step ST4). As a consequence, when a defective print status on the substrate Pb is not found, the parts Pt are mounted on the substrate Pb (step ST5, the part-mounting process). After mounting the parts Pt on the substrate Pb is completed, the substrate Pb is conveyed to the second part-mounting machine 4B that is a downstream apparatus (step ST6). By contrast, when a defective print status on the substrate Pb is found in step ST4, the substrate Pb is conveyed to the second part-mounting machine 4B that is a downstream apparatus without performance of processing pertaining to the process for mounting parts on the substrate Pb (step ST6).

In the meantime, when detected in step ST2 that the reload button BT has been actuated, the control unit 20A of the first part-mounting machine 4A determines that the substrate Pb is reloaded and inspects a parts-missing location on the substrate Pb by use of the inspection camera 15A used in step ST3 without making an inspection about whether or not the print status of the solder Sd is defective in connection with all of the electrodes DT on the substrate Pb (step ST7, the parts-missing location inspection process). When a defective bonded state of the solder Sd is found in relation to the parts-missing locations, the solder Sd is additionally fed to the location (step ST8, the additional solder feed process), and the parts Pt are mounted to the parts-missing location (step ST9, the parts-missing location part-mounting process). After mounting the parts Pt on the parts-missing location is completed, the substrate Pb is conveyed to the second part-mounting machine 4B that is a downstream apparatus (step ST6).

In FIG. 8, the control unit 20B of the second part-mounting machine 4B conveys the substrate Pb sent from the first part-mounting machine 4A that is an upstream apparatus into the machine and positions the substrate (step ST11). Subsequently, the control unit determines whether or not reload information is delivered from the first part-mounting machine 4A in relation to the substrate Pb (step ST12). As a consequence, when the reload information is detected not to have been sent, the substrate Pb is determined not to be reloaded into the first part-mounting machine 4A. It is also determined whether or not the substrate Pb is a substrate Pb including the location where the first part-mounting machine 4A found a defective print status of the solder Sd (step ST13). When a determination result shows that the substrate Pb is not the substrate Pb in which the first part-mounting machine 4A found the defective print status of the solder Sd, the parts Pt are mounted to the substrate Pb (step ST14, the part-mounting process).

In the meantime, upon detecting in step ST12 that the reload information has been sent from the first part-mounting machine 4A, the control unit 20B of the second part-mounting machine 4B determines that the substrate Pb was reloaded. According to parts-missing information sent from the first part-mounting machine 4A, the control unit mounts parts Pt to the parts-missing location on the substrate Pb where the second part-mounting machine 4B takes the task of mounting parts Pt (step ST15, the parts-missing location mounting process).

After processing pertaining to the part-mounting process in step ST14 or processing pertaining to the parts-missing location mounting process in step ST15 is completed, the control unit 20B of the second part-mounting machine 4B inspects a repair-requiring location (step ST16, the repair-requiring location inspection process). When the repair-requiring location is not found as a result of the determination being made as to whether or not the repair-requiring location is found (step ST17), the substrate Pb is conveyed to the second substrate conveyor machine 3B that is a downstream apparatus (step ST18). When the repair-requiring location is found, the thus-found repair-requiring location is displayed on the display unit 6 (step ST19, a repair-requiring display process), and the substrate Pb is conveyed to the second substrate conveyor machine 3B (step ST18).

In contrast, when the determination rendered in step ST13 shows that the substrate Pb received from the first part-mounting machine 4A is the substrate Pb including the location at which first part-mounting machine 4A found a defective print status of the solder Sd, the control unit 20B of the second part-mounting machine 4B conveys the substrate Pb to the second substrate conveyor machine 3B that is a downstream apparatus without performing processing pertaining to the process of mounting parts on the substrate Pb (step ST18).

In FIG. 1, the second substrate conveyor machine 3B receives the substrate Pb conveyed out from the second part-mounting machine 4B that is an upstream apparatus, by means of the substrate track 3a, and conveys the substrate out to the reflow furnace 5 that is a downstream apparatus. The reflow furnace 5 receives the substrate Pb conveyed out from the second substrate conveyor machine 3B (the substrate Pb having finished undergoing mounting of the parts Pt) by means of the substrate track 5a, and the solder Sd on the substrate Pb is subjected to reflow while the substrate Pb is being conveyed in the X-axis direction. The substrate Pb having undergone reflow of the solder Sd is conveyed downstream from the substrate track 5a. The substrate Pb conveyed out from the reflow furnace 5 undergoes final inspection in the unillustrated appearance tester. When the substrate is determined to be a non-defective substrate through final inspection, the substrate Pb is picked up as a non-defective substrate. Whereas, when the substrate is determined to be defective, the substrate Pb is picked up as a defective substrate.

As mentioned above, the part-mounting system 1 of the present embodiment includes the solder print portion (the solder printer 2) that prints the loaded substrate Pb with solder Sd; the part-mounting portion (the mounting head 14A and the control unit 20A of the first part-mounting machine 4A and the mounting head 14B and the control unit 20B of the second part-mounting machine 4B) that mounts parts Pt on the substrate Pb printed with the solder Sd by the solder print portion; the repair-requiring location inspection portion (the inspection camera 15B and the control unit 20B in the second part-mounting machine 4B) that inspects whether or not a repair-requiring location exists on the substrate Pb on which the parts Pt are mounted by the part-mounting portion and that, when the repair-requiring location exists on the substrate Pb, locates the repair-requiring location; and the repair-requiring location display portion (the display unit 6) for displaying the repair-requiring location identified by the repair-requiring location inspection portion. The part-mounting system further includes the parts-missing location inspection portion (the inspection camera 15A and the control unit 20A of the first part-mounting machine 4A) that makes an inspection as to whether or not a parts-missing location exists on the substrate Pb that is reloaded between the solder print portion and the part-mounting portion (i.e., between the solder printer 2 and the first part-mounting machine 4A) after having undergone manual repair of the repair-requiring location displayed on the repair-requiring location display portion by the worker, like an operator OP, and that, when the parts-missing location exists on the substrate Pb, identifies the parts-missing location. The part-mounting portion mounts parts on the parts-missing location on the substrate Pb identified by the parts-missing location inspection portion.

Moreover, the part-mounting method of the present embodiment includes the solder print process of printing the loaded substrate Pb with solder Sd; the part-mounting process of mounting parts Pt on the substrate Pb printed with the solder Sd in the solder print process (step ST5 and step ST14); the repair-requiring location inspection process of inspecting whether or not a repair-requiring location exists on the substrate Pb on which the parts Pt are mounted in the part-mounting process and identifying the repair-requiring location when the repair-requiring location exists on the substrate Pb (step ST16); and the repair-requiring location display process of displaying the repair-requiring location identified in the repair-requiring location inspection process (step ST19). Under the method, there are performed processing pertaining to the parts-missing location inspection process of making an inspection as to whether or not a parts-missing location exists on the substrate that has undergone manual repair of the repair-requiring location displayed in the repair-requiring location display process by the worker, like an operator OP, and, when the parts-missing location exists on the substrate Pb, identifying the parts-missing location (step ST7); and processing pertaining to the parts-missing location part-mounting process of mounting parts Pt at the parts-missing location on the substrate Pb identified in the parts-missing location inspection process (step ST9 and step ST15).

In the part-mounting system 1 of the embodiment, the parts-missing location inspection portion (the inspection camera 15A and the control unit 20A of the first part-mounting machine 4A) makes an inspection as to whether or not a parts-missing location exists on the substrate Pb reloaded between the solder print portion and the part-mounting portion (the solder printer 2 and the first part-mounting machine 4A) after having undergone manual repair by the worker, like an operator OP, in connection with the repair-requiring location found through inspection performed by the repair-requiring location inspection portion (the inspection camera 15B and the control unit 20B of the second part-mounting machine 4B) after mounting of the parts Pt. When the parts-missing location on the substrate Pb is found, the parts-missing location is identified. Subsequently, the part-mounting portion (the mounting head 14A and the control unit 20A of the first part-mounting machine 4A and the mounting head 14B and the control unit 20B of the second part-mounting machine 4B) mounts parts Pt at the parts-missing location on the thus-identified substrate Pb. Therefore, the worker, like an operator OP, does not need to mount the parts Pt at the repair-requiring location. Laborious operation also becomes obviated. Further, even when the parts Pt are extremely small, the parts Pt can be mounted to the repair-requiring location with reliability, so that a percentage of a non-defective substrate Pb can be enhanced.

In the part-mounting system 1 of the embodiment, the parts-missing location inspection portion (the inspection camera 15A and the control unit 20A of the first part-mounting machine 4A) makes an inspection as to whether or not a bonded state of the solder Sd at the parts-missing location on the substrate Pb reloaded between the solder print portion and the part-mounting portion (the solder printer 2 and the first part-mounting machine 4A) is defective. The part-mounting portion (the mounting head 14A and the control unit 20A of the first part-mounting machine 4A) has the transfer pins 14t that serve as an additional solder feed portion for additionally feeding the solder Sd to the location at which the bonded state of the solder Sd is determined to be defective. The worker, like an operator OP, becomes unnecessary to perform extremely laborious operation, such as an inspection about whether or not a location including a defective bonded state of the solder Sd exists on the substrate Pb to be reloaded and additionally feeding the solder Sd to the location where the bonded state of the solder Sd is defective. Therefore, productivity can be remarkably enhanced.

In the part-mounting system 1 of the present embodiment, the parts-missing location inspection portion is arranged so as to inspect whether or not the print status of the solder Sd on the substrate Pb achieved immediately after the solder Sd has been printed by means of the solder print portion is defective. A necessity for an additional custom-designed inspection machine for inspecting a print status of the solder Sd is obviated, so that the part-mounting system 1 can be made compact.

Although the embodiment of the present invention has been described thus far, the present invention is not limited to the embodiment provided above. For instance, in the foregoing embodiment, the number of part-mounting machines making up the part-mounting portion is two (i.e., the first part-mounting machine 4A and the second part-mounting machine 4B). However, a specific limit is not imposed on the number of part-mounting machines. In the embodiment, the repair-requiring location inspection portion (the inspection camera 15B and the control unit 20B) are arranged in the same machine (the second part-mounting machine 4B) where the part-mounting portion (the mounting head 14B and the control unit 20B) are provided. Further, the parts-missing location inspection portion (the inspection camera 15A and the control unit 20B) are arranged in the same machine (the first part-mounting machine 4A) where the part-mounting portion (the mounting head 14A and the control unit 20A) are provided. However, there is not always a necessity to adopt such a configuration. The repair-requiring location inspection portion and the part-mounting portion may also be built from devices that are separate from each other (e.g., the repair-requiring location inspection portion is built from an inspection machine custom designed for inspecting a repair-requiring location and the part-mounting portion is built from a part-mounting machine specifically designed for mounting parts) Likewise, the parts-missing location inspection portion and the part-mounting portion may also be built from devices that separate from each other (e.g., the parts-missing location inspection portion is built from an inspection machine specifically designed for inspecting a parts-missing location and the part-mounting portion is built from a part-mounting machine specifically designed for mounting parts).

In the embodiment, the control unit 20A of the first part-mounting machine 4A is arranged so as to determine whether or not a loaded substrate Pb is a reloaded substrate, according to a result of a determination as to whether or not the operator OP actuates the reload button BT. Further, the control unit 20B of the second part-mounting machine 4B is arranged so as to determine whether or not a substrate Pb conveyed in the machine is a reloaded substrate when received the reload information from the first part-mounting machine 4A. The substrate Pb is provided with an ID code, like a barcode. Further, the first part-mounting machine 4A and the second part-mounting machine 4B are arranged so as to be able to read information unique to the substrate Pb from the ID code provided on the substrate Pb. If such a configuration is available, an ID code of the substrate Pb determined to include a repair-requiring location by way of the second inspection camera 15B of the second part-mounting machine 4B may be stored. When the substrate Pb having the ID code is again conveyed into the machine, the substrate Pb can also be determined to be a reloaded substrate Pb.

The present invention is expected to be susceptible to various alterations or applications conceived by those skilled in the art according to the descriptions of the present patent specification and the well-known techniques without departing the spirit and scope of the present invention, and the alterations or applications shall fall within a range where protection of the present invention is sought. Moreover, the constituent elements described in connection with the embodiment may also be arbitrarily combined together within a scope of the gist of the present invention.

The present patent application is based on Japanese Patent Application (JP-A-2009-234039) filed on Oct. 8, 2009, the entire subject matter of which is incorporated herein by reference.

INDUSTRIAL APPLICABILITY

There are provided a part-mounting system and a part-mounting method that, even when parts are extremely small, make it possible to mount the parts at a repair-requiring location without fail, to thus enhance a percentage of a non-defective substrate.

DESCRIPTIONS OF THE REFERENCE NUMERALS AND SYMBOLS

1 PART-MOUNTING SYSTEM
2 SOLDER PRINTER (SOLDER PRINT PORTION)
6 DISPLAY UNIT (REPAIR-REQUIRING LOCATION DISPLAY PORTION)
14A, 14B MOUNTING HEAD (PART-MOUNTING PORTION)
14t TRANSFER PIN (ADDITIONAL SOLDER FEED PORTION)
15A INSPECTION CAMERA (PARTS-MISSING LOCATION
INSPECTION PORTION)
15B INSPECTION CAMERA (REPAIR-REQUIRING LOCATION INSPECTION PORTION)
20A CONTROL UNIT (PART-MOUNTING PORTION, PARTS-MISSING LOCATION INSPECTION PORTION)
20B CONTROL UNIT (PART-MOUNTING PORTION, REPAIR-REQUIRING LOCATION INSPECTION PORTION)
Sd SOLDER
Pt PART
Pb SUBSTRATE
OP OPERATOR (WORKER)

The invention claimed is:

1. A part-mounting, inspecting and repairing method comprising:
a solder print process of printing a loaded substrate with solder;
a part-mounting process of mounting parts on the substrate printed with the solder in the solder print process;
a repair-requiring location inspection process of inspecting whether or not a repair-requiring location exists on the substrate on which the parts are mounted in the part-mounting process and identifying the repair-requiring location if the repair-requiring location exists on the substrate;
a repair-requiring location display process of displaying the repair-requiring location identified in the repair-requiring location inspection process;
a manually-repairing process of manually repairing the repair-requiring location by a worker;
a parts-missing location inspection process of making an inspection as to whether or not a parts-missing location exists on the substrate manually repaired by the worker in the manually-repairing process at the repair-requiring location displayed in the repair-requiring location display process and identifying the parts-missing location if the parts-missing location exists on the substrate; and
a parts-missing location part-mounting process of mounting parts at the parts-missing location on the substrate identified in the parts-missing location inspection process.

2. The part-mounting, inspecting and repairing method according to claim 1, wherein the parts-missing location inspection process makes an inspection as to whether or not a bonded state of the solder at the parts-missing location on the substrate reloaded between the solder print process and the part-mounting process is defective, and the part-mounting process additionally feeds solder to a location at which the bonded state of the solder is determined to be defective.

3. The part-mounting, inspecting and repairing method according to claim 1 or 2, wherein the parts-missing location inspection process makes an inspection as to whether or not a print status of solder on the substrate achieved immediately after the substrate has been printed with solder by the solder print process is defective.

* * * * *